(12) United States Patent
Polnyi

(10) Patent No.: US 7,575,440 B1
(45) Date of Patent: Aug. 18, 2009

(54) IC SOCKET CAPABLE OF SAVING SPACE ON A SYSTEM BOARD

(75) Inventor: Igor Polnyi, Aurora, IL (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/229,628

(22) Filed: Aug. 25, 2008

(51) Int. Cl.
*H01R 12/00* (2006.01)
(52) U.S. Cl. ...................................... 439/71
(58) Field of Classification Search ............. 439/71, 439/69–70, 66, 83, 948, 862, 342, 620
See application file for complete search history.

(56) References Cited

U.S. PATENT DOCUMENTS

| | | | |
|---|---|---|---|
| 6,695,625 B1 | 2/2004 | Ma et al. | |
| 6,743,037 B2 * | 6/2004 | Kassa et al. | 439/342 |
| 6,884,088 B2 * | 4/2005 | Kajinuma et al. | 439/70 |
| 7,210,225 B2 * | 5/2007 | Olson et al. | 29/882 |
| 7,377,792 B2 | 5/2008 | Ma | |
| 2005/0059276 A1 * | 3/2005 | Lee et al. | 439/83 |
| 2005/0064739 A1 * | 3/2005 | Searls et al. | 439/66 |

\* cited by examiner

*Primary Examiner*—Jean F Duverne
(74) *Attorney, Agent, or Firm*—Wei Te Chung

(57) ABSTRACT

An IC socket (1) mounted on a system board (4) for connecting an IC package comprises a socket body (2) defining an upper interface (21) for receiving the IC package and a bottom mounting surface (22) opposite to the interface (21), and a plurality of contacts (3) received in the socket body (2). The socket body (2) has at least one undercut (26) at the bottom thereof for accommodating other elements (5) on the system board (4).

6 Claims, 4 Drawing Sheets

IC SOCKET CAPABLE OF SAVING SPACE ON A SYSTEM BOARD

BACKGROUND OF THE INVENTION

1. Field of the Invention

The present invention relates to an IC socket, and particularly to an IC socket has a recessed portion thereunder adapted for accommodating other elements mounted on a system board.

2. Description of Related Art

IC sockets are widely used for mounted on a system board to electrically connect an IC package. A grid of spring contacts are received in the IC socket to electrically mate with conductive pads on a low surface of the IC package, so as to make electrical connection between the IC package and the system board. To promises the elasticity of the contact, long spring arm that extending obliquely is usually employed so that big deformation to the spring arms is able to be achieved.

FIG. 1 is a sectional view of a conventional IC socket including an insulative socket body 2' with a plurality of passageways 20'. A number of contacts 3' are held in the passageways 20' and therefore mounted within the socket body 2'. The contacts 3' have spring arms 31' extending in a same inclined direction. The spring arms 31' deform when an IC package is loaded on the IC socket so that electrical connection is established therebetween. However, as shown in FIG. 1, the portion of the socket body that under the spring arms 31' of the side-most contacts 3' is excessive, since it's far away from the corresponding passageways 20' for the side-most contacts 3' and brings no contribution to construct these passageways 20'. Therefore, it is indeed a waste of insulative material and unnecessarily occupying an area on the system board 4'.

In view of the above, a new IC socket capable of saving space and material is desired.

SUMMARY OF THE INVENTION

Accordingly, an object of the present invention is to provide an IC socket capable of saving space on the system board.

To achieve the above object, an IC socket for connecting an IC package is provided. The IC socket comprises a socket body defining an upper interface for receiving the IC package and a bottom mounting surface opposite to the interface, and a plurality of contacts received in the socket body. The socket body has at least one undercut at the bottom thereof to form an accommodating space. The undercut extends through the bottom surface and is located under at least one portion of at least one contact in a side-most position.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
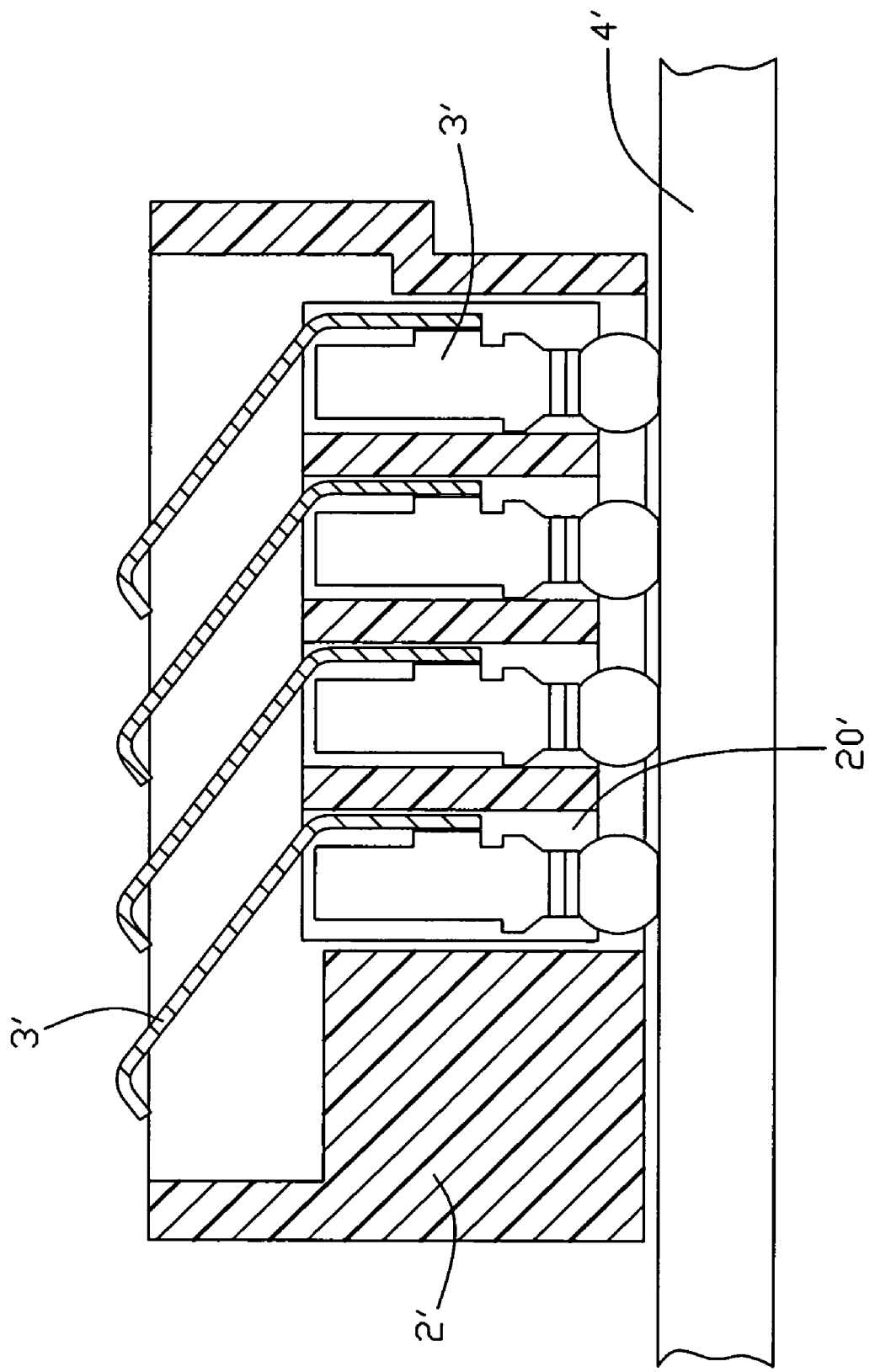
FIG. 1 is a sectional view of a conventional IC socket mounted on a system board.
Figure 2:
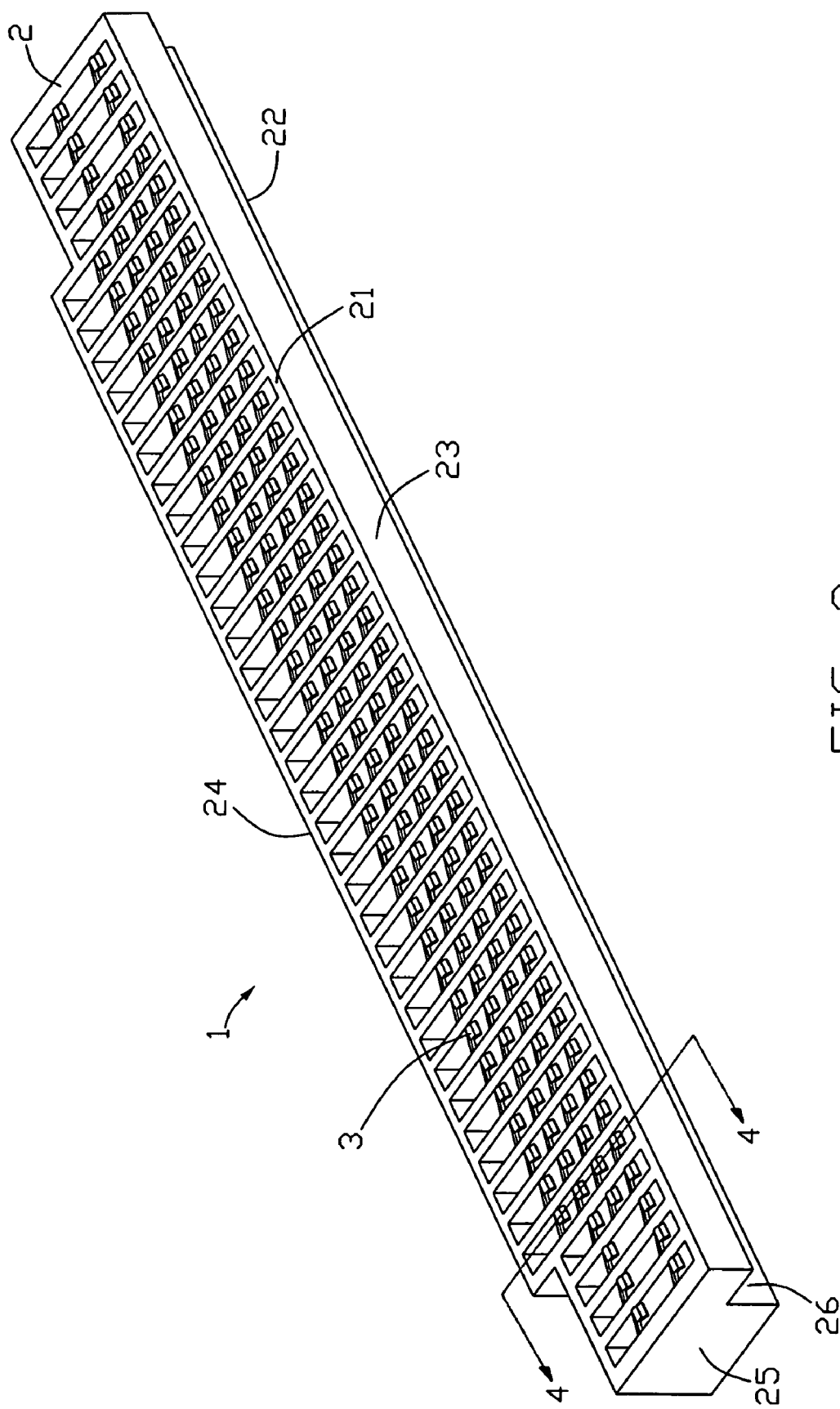
FIG. 2 is an assembled, perspective view of an IC socket mounted on a system board, made in accordance with the preferred embodiment of the present invention.

FIG. 2 is an assembled, perspective view of the IC socket 1 made in accordance with a preferred embodiment of the present invention. The IC socket 1 is commonly mounted onto a system board 4 to electrically connect an IC package (not shown). The IC socket 1 includes a socket body 2 with a number of passageways 20 therein, and a plurality of contacts 3 respectively received in the passageways 20 and are disposed in a substantial matrix pattern.

Figure 3:
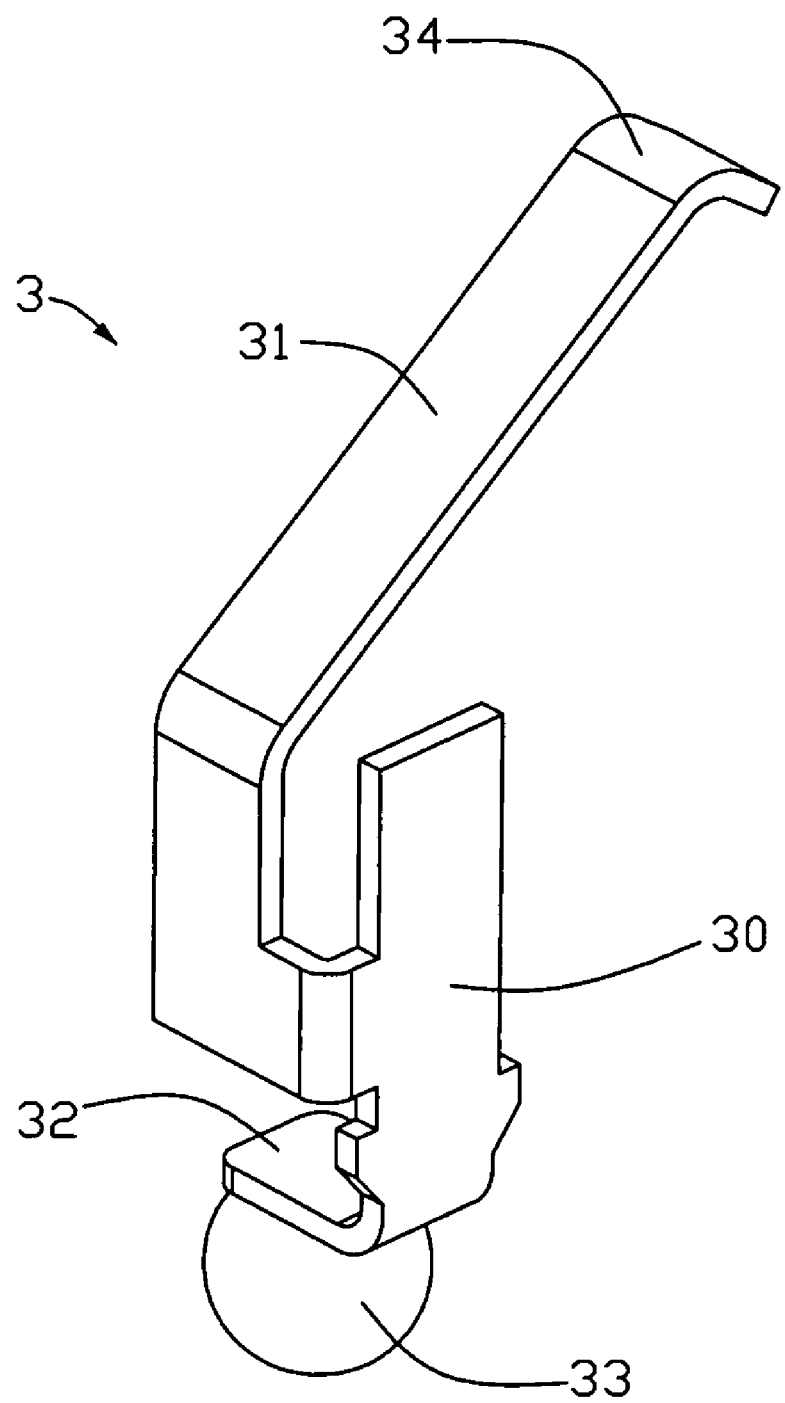
FIG. 3 is a perspective view of a contact of the IC socket, made in accordance with the preferred embodiment of the present invention.

As shown in FIG. 3, the contact 3 has a base portion 30, a spring arm 31 extend upwardly and obliquely from the base portion 30, and a solder pad 32 extending and bending from an end portion of the base portion 30. A solder ball 33 is attached to the bottom of the solder pad 32 for facilitate the soldering jointment onto the system board 4. The spring arms 31 of all the contacts 3 extending out of the socket body 2 in a same direction and parallel to each other. The free end of the spring arm 31 is formed with a contacting portion 34, which is to be connected with a conductive pad on a lower surface of the IC package.

Figure 4:
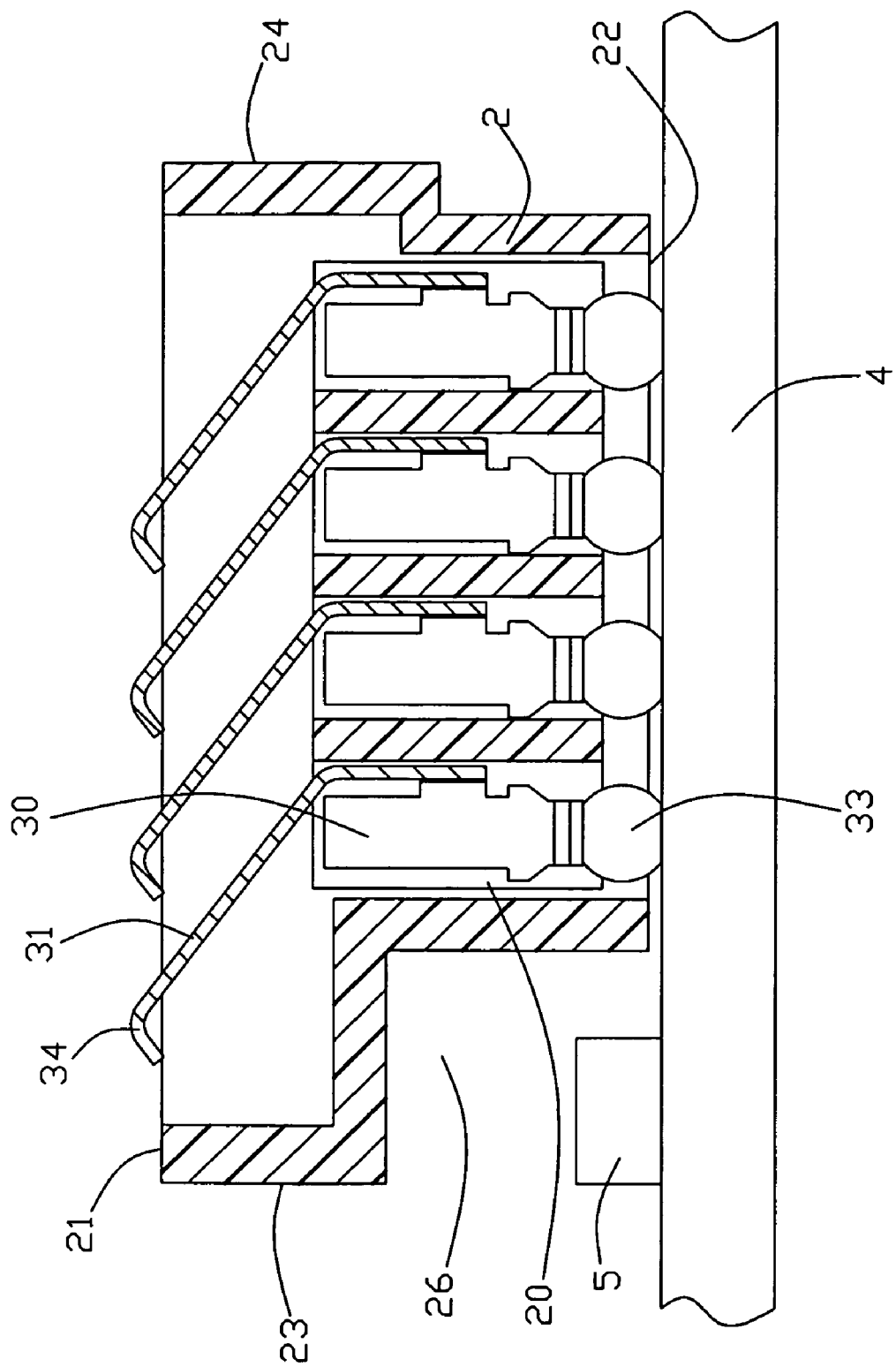
FIG. 4 is a sectional view of the IC socket, taken along the line A-A in FIG. 2, in which another element mounted on the system board is contained in a undercut of the IC socket.

As shown in FIG. 2 and FIG. 4, the socket body 2 has a longitudinal configuration, and defines an upper interface 21 for receiving the IC package and an opposite bottom mounting surface 22 for mating with the system board 4. The passageways 20 are vertically formed between the upper interface 21 and the bottom mounting surface 22. The socket body 2 further defines a pair of opposite front wall 23 and rear wall 24, which both extend along a longitude direction, and a pair of opposite side walls 25. An undercut 26 that extending along the longitude direction is formed at the bottom of the socket body 2. The undercut 26 extends through the front wall 23, the mounting surface 22 and the pair of the side walls 25, but not through the rear wall 24 and the interface 21, so that another element 5 on the system board 4, for example, capacitors or resistors, can be accommodated in the undercut 26. The undercut 26 is under the spring arms 31 of the side-most row of the contacts 3. Between the spring arms 31 of the side-most row of the contacts 3 and the undercut 26, there is one portion of the socket body 2 which performs as a block between them. Due to the undercut 26, the socket body 2 is also able to be divided to two parts, an upper contact mating portion (not labeled), into which the spring arms 31 of the contacts 3 extend, and a lower contact receiving portion (not labeled), in which the base portion 30 of the contacts 3 are retained.

As above detail description regarding to the best mode of the present invention, it can be seen that the space on system board 4 is effectively saved for containing other elements because of the undercut 26, and the insulative material is also saved by excavating from the bottom of the socket body 2.

The present invention is not limited to the embodiment described above. Various modifications are possible. For example, the grid of contacts 3 may be divided to two groups, which respectively having spring arms extending in a direction opposite to each other. Under this circumstance, two undercuts 26 is likely to be provided respectively at two opposite sides and are located under the spring arms of the side-most contacts from both groups. Another embodiment for example, the undercut may not extend through the side walls 25 and is located between the two opposite side walls

25. Besides, the configuration or structure of the undercut 26 is also changeable according to special needs.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An IC socket for connecting an IC package comprising:
   a socket body defining an upper interface for receiving the IC package and a bottom mounting surface opposite to the interface; and
   a plurality of contacts received in the socket body, the contacts being arranged in a substantial matrix pattern;
   wherein the socket body has at least one undercut at the bottom thereof to form an accommodating space, the undercut extending through the bottom surface and located under at least one portion of at least one contact in a side-most position;
   wherein at least one group of the contacts have spring arms extending in a same direction, the undercut being located under the spring arms of said group of the contacts.

2. The IC socket as claimed in claim 1, wherein the undercut and the spring arms are separated from each other by one portion of the socket body formed therebetween.

3. An IC socket mounted on a system board for connecting an IC package comprising:
   a socket body defining an upper interface for receiving the IC package and a bottom mounting surface opposite to the interface; and
   a plurality of contacts received in the socket body and arranged in a substantial matrix pattern;
   wherein the socket body is excavated from the bottom thereof so as to form an excavated cavity that directly joined with the system board, so that at least one element on the system board is able to be contained in the excavated cavity;
   wherein at least one row of the contacts have spring arms with free ends right above the excavated cavity.

4. The IC socket as claimed in claim 3, wherein one portion of the socket body is formed between the excavated cavity and spring arms so as to block them form each other.

5. The IC socket as claimed in claim 4, wherein the excavated cavity is located under the spring arms of one side-most row of the contacts.

6. An IC socket for connecting an IC package comprising:
   a socket body defining a contact receiving portion and a contact mating portion above the contact receiving portion;
   a plurality of contacts received in the socket body, each contact including a retaining portion retained in the contact receiving portion and a mating portion extending into the contact mating portion; and
   a recessed portion defined between a junction of the contact receiving portion and the contact mating portion, the recessed portion being located under the mating portions of the contacts positioned in a side-most position;
   wherein the mating portion of the contact is offset from the retaining portion of the contact in a direction along which the mating portion extends in a top view;
   wherein the mating portion of the contact is overlapped, in a vertical direction, with that of an adjacent contact which is located thereabouts in said direction, except that the mating portions of the contacts located in the side-most position are overlapped with the recessed portion in the vertical direction.

\* \* \* \* \*